United States Patent
Yoshida et al.

(10) Patent No.: US 10,103,704 B2
(45) Date of Patent: Oct. 16, 2018

(54) DIPLEXER MODULE WITH SWITCH AND DIPLEXER MODULE

(71) Applicant: Murata Manufacturing Co., Ltd., Nagaokakyo-shi, Kyoto-fu (JP)

(72) Inventors: Masato Yoshida, Nagaokakyo (JP); Tadashi Washimori, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 46 days.

(21) Appl. No.: 15/433,161

(22) Filed: Feb. 15, 2017

(65) Prior Publication Data

US 2017/0244374 A1 Aug. 24, 2017

(30) Foreign Application Priority Data

Feb. 22, 2016 (JP) .................. 2016-031533

(51) Int. Cl.
| H03H 7/46 | (2006.01) |
| H03H 7/01 | (2006.01) |
| H01P 5/16 | (2006.01) |
| H01P 1/213 | (2006.01) |
| H03H 7/06 | (2006.01) |

(52) U.S. Cl.
CPC ........... *H03H 7/0138* (2013.01); *H01P 1/213* (2013.01); *H01P 5/16* (2013.01); *H03H 7/0115* (2013.01); *H03H 7/06* (2013.01)

(58) Field of Classification Search
CPC ...... H03H 7/0138; H03H 7/0115; H03H 7/06; H01P 5/16; H01P 1/213

USPC ......................................................... 333/132
See application file for complete search history.

(56) References Cited

U.S. PATENT DOCUMENTS

| 8,849,362 B1 | 9/2014 | Saji et al. |
| 2003/0076194 A1 | 4/2003 | Machui |
| 2006/0117163 A1 | 6/2006 | Okuyama et al. |
| 2014/0167877 A1 | 6/2014 | Shimizu et al. |

FOREIGN PATENT DOCUMENTS

| JP | 2006-140862 A | 6/2006 |
| JP | 2015-111803 A | 6/2015 |
| KR | 10-2004-0090891 A | 10/2004 |
| KR | 10-1533313 B1 | 7/2015 |
| WO | 2013/021626 A1 | 2/2013 |
| WO | 2013/047357 A1 | 4/2013 |

OTHER PUBLICATIONS

Official Communication issued in corresponding Korean Patent Application No. 10-2017-0000641, dated Feb. 7, 2018.

*Primary Examiner* — Robert J Pascal
*Assistant Examiner* — Kimberly Glenn
(74) *Attorney, Agent, or Firm* — Keating & Bennett, LLP

(57) ABSTRACT

A diplexer module includes substrates, an external connection terminal, a first diplexer including a first transmission filter and a first reception filter, a second diplexer including a second transmission filter and a second reception filter, and a switch. The external connection terminal is connected to the switch, the switch is connected to the first diplexer and the second diplexer, and the first transmission filter, the second transmission filter, the second reception filter, and the first reception filter are aligned in this order when the substrates are seen in plan view from above.

17 Claims, 9 Drawing Sheets

DIPLEXER MODULE WITH SWITCH AND DIPLEXER MODULE

CROSS REFERENCE TO RELATED APPLICATIONS

This application claims the benefit of priority to Japanese Patent Application No. 2016-031533 filed on Feb. 22, 2016. The entire contents of this application are hereby incorporated herein by reference.

BACKGROUND OF THE INVENTION

1. Field of the Invention

The present invention relates to a diplexer module including a switch, and more specifically, relates to a diplexer module including a switch that has excellent isolation characteristics between transmission and reception sides.

Furthermore, the present invention relates to a diplexer module, and more specifically, relates to a diplexer module that has excellent isolation characteristics between transmission and reception sides.

2. Description of the Related Art

Data over cable service interface specifications (DOCSIS) (registered trademark) is defined as a standard of high-speed data communication using a cable television line, and data communication services based on the standard are used in many countries.

The DOCSIS has been improved many times and version upgrading has been provided. Further version upgrading of the DOCSIS is planned in the future.

In the version upgrading of the DOCSIS, a communication frequency is changed in some cases.

The DOCSIS requires a communication apparatus of a new version to be capable of being used in an old version, in other words, requires the communication apparatus of the new version to support a communication frequency of the old version when the communication frequency is changed in the version upgrading. That is to say, the DOCSIS requires the new communication apparatus to be capable of being used in both of a service area in which the old version is used and a service area in which the new version is used with compatibility. Therefore, when it is desired that one communication apparatus is used to perform bidirectional communication with a plurality of communication frequencies as in communication based on the DOCSIS, a diplexer module including a switch using a plurality of diplexers supporting the DOCSIS of the latest version and the DOCSIS of the old version in a switching manner is used for a set top box connecting an external antenna or cable and an internal (in-room) communication line in some cases.

Japanese Unexamined Patent Application Publication No. 2015-111803 discloses such a diplexer module that includes a switch.

FIG. 8 illustrates a diplexer module (communication module) 1100 including a switch as disclosed in Japanese Unexamined Patent Application Publication No. 2015-111803.

The diplexer module including the switch 1100 includes a plurality of transmission and reception systems having different frequency bands and also supports the global positioning system (GPS) and the WiFi (registered trademark) communication. Hereinafter, the diplexer module including the switch 1100 is described for only portions that are used as references for a diplexer module including a switch according to the invention.

The diplexer module 1100 includes a switch 101. A fixed terminal of the switch 101 is connected to an antenna 102. One switching terminal of the switch 101 is connected to a first diplexer 103 and another switching terminal of the switch 101 is connected to a second diplexer 104.

The first diplexer 103 includes a first transmission filter 103a and a first reception filter 103b. In the same manner, the second diplexer 104 includes a second transmission filter 104a and a second reception filter 104b.

Furthermore, the diplexer module 1100 includes a radio frequency integrated circuit (RFIC) 105 as a portion of a high-frequency circuit of a communication apparatus. The RFIC 105 includes a plurality of TX terminals and a plurality of RX terminals. Normally, related TX terminals of an RFIC are adjacent to each other and related RX terminals thereof are adjacent to each other. Also for the RFIC in the diplexer module 1100, the related TX terminals thereof are adjacent to each other and the related RX terminals thereof are adjacent to each other.

One TX terminal of the RFIC 105 is connected to the first transmission filter 103a of the first diplexer 103 and another adjacent TX terminal of the RFIC 105 is connected to the second transmission filter 104a of the second diplexer 104. In the same manner, one RX terminal of the RFIC 105 is connected to the first reception filter 103b of the first diplexer 103 and another adjacent RX terminal of the RFIC 105 is connected to the second reception filter 104b of the second diplexer 104.

The diplexer module 1100 disclosed in Japanese Unexamined Patent Application Publication No. 2015-111803 switches the switch 101, thus performing communication with a first frequency band using the first diplexer 103 and communication with a second frequency band using the second diplexer 104 in a switching manner.

In the diplexer module 1100 disclosed in Japanese Unexamined Patent Application Publication No. 2015-111803, as illustrated in FIG. 8, a point P at which signal lines intersect with each other is provided between the first diplexer 103 and the second diplexer 104 and the RFIC 105. To be more specific, a reception signal line connecting the first reception filter 103b of the first diplexer 103 and the RX terminal of the RFIC 105 and a transmission signal line connecting the second transmission filter 104a of the second diplexer 104 and the TX terminal of the RFIC 105 intersect with each other at the point P.

FIG. 9A is a schematic circuit diagram of the diplexer module 1100. FIG. 9B is a schematic circuit diagram of a variation of the diplexer module 1100, which has been arbitrarily produced by the inventors of the present invention. As shown in FIG. 9A, it is considered that the point P at which the signal lines intersect with each other occurs in the diplexer module 1100 because the related TX terminals of the RFIC 105 are adjacent to each other and the related RX terminals thereof are adjacent to each other. As in the variation of the diplexer module 1100 as illustrated in FIG. 9B, when a second switch SW2 and a third switch SW3 are additionally added, the first transmission filter 103a and the second transmission filter 104a are connected to the TX terminal of the RFIC 105 with the second switch SW2 interposed therebetween, and the first reception filter 103b and the second reception filter 104b are connected to the RX terminal of the RFIC 105 with the third switch SW3 interposed therebetween, the point P at which signal lines intersect with each other also occurs in the same manner.

There is a risk that the intersection of the signal lines at the point P in the diplexer module 1100 disclosed in Japanese Unexamined Patent Application Publication No. 2015-

111803 generates signal interference and causes deterioration in communication quality of the module 1100. For this reason, the intersection of the signal lines is extremely disadvantageous. That is to say, there is a risk that a transmission signal directing to the second transmission filter 104a of the second diplexer 104 from the TX terminal of the RFIC 105 is mixed into a reception signal directing to the RX terminal of the RFIC 105 from the first reception filter 103b of the first diplexer 103 at the point P. In the same manner, there is a risk that the reception signal directing to the RX terminal of the RFIC 105 from the first reception filter 103b of the first diplexer 103 is mixed into the transmission signal directing to the second transmission filter 104a of the second diplexer 104 from the TX terminal of the RFIC 105 at the point P. In these interferences, when a portion of the reception signal is mixed into the transmission signal, it can be attenuated by the second transmission filter 104a and therefore, no problems arise in this case. On the other hand, when a portion of the transmission signal is mixed into the reception signal, as illustrated in FIGS. 9A and 9B, an S/N ratio is deteriorated because not only an unnecessary signal can be attenuated only in the RFIC 105 but also the transmission signal has a larger amplitude than the weak reception signal, resulting in a significant problem that reception sensitivity is deteriorated.

SUMMARY OF THE INVENTION

In order to avoid the problems described above, in a diplexer module including a switch according to a preferred embodiment of the present invention, intersection of signal lines is avoided between diplexers and a high-frequency circuit, such as an RFIC or other suitable high-frequency circuit. More specifically, the diplexer module including the switch according to a preferred embodiment of the present invention includes a substrate, an external connection terminal provided on the substrate, a first diplexer provided on the substrate and including a first transmission filter and a first reception filter, a second diplexer provided on the substrate and including a second transmission filter and a second reception filter, and a switch disposed on the substrate, wherein the external connection terminal is connected to a fixed terminal of the switch, one switching terminal of the switch is connected to the first diplexer and the other switching terminal of the switch is connected to the second diplexer, and the first transmission filter, the second transmission filter, the second reception filter, and the first reception filter are aligned in this order when the substrate is seen in plan view from above.

The external connection terminal is a terminal that connects the diplexer module to a cable, an antenna, or other suitable component of a cable television. With the above-described configuration, the first diplexer and the second diplexer are able to commonly use one external connection terminal as a common terminal.

The switch connected between the external connection terminal and the first diplexer and the second diplexer is referred to as a first switch in some portions of the present specification.

It is preferable that a signal line connecting the external connection terminal and the switch intersect with an internal signal line of one of the first diplexer and the second diplexer when the substrate is seen in plan view from above. In this case, the intersection of signal lines between the diplexers and a high-frequency circuit, such as an RFIC or other suitable high-frequency circuit, is able to be avoided.

It is preferable that a transmission terminal and a reception terminal be provided on the substrate, and a second switch and a third switch be provided on the substrate, the first transmission filter be connected to one switching terminal of the second switch, the second transmission filter be connected to the other switching terminal of the second switch, and a fixed terminal of the second switch be connected to the transmission terminal, and the first reception filter be connected to one switching terminal of the third switch, the second reception filter be connected to the other switching terminal of the third switch, and a fixed terminal of the third switch be connected to the reception terminal. In this case, the first diplexer and the second diplexer are able to commonly use each of the transmission terminal and the reception terminal.

It is preferable that the substrate include a substantially U-shaped first region and a substantially rectangular second region provided at an inner side of the substantially U-shaped portion of the first region when the substrate is seen in plan view from above, the first diplexer be provided in the first region, and the second diplexer be provided in the second region. In this case, intersections of signal lines between the diplexers and the high-frequency circuit are easily avoided.

It should be noted that in the present specification, the expression "substantially U shape" can be replaced by a substantially π shape, a substantially C shape, a substantially square shape with a left side open, or other suitable shapes. Furthermore, the substantially U shape includes a shape that includes another shape added to the substantially U shape and a substantially rounded shape.

Moreover, in the present specification, the expression of the "substantially rectangular shape" includes a substantially oblong shape and a substantially square shape, and also includes a shape including another shape added to the substantially rectangular shape and a substantially rounded shape. Furthermore, angles of corner portions of the substantially rectangular shape may be right angles or angles other than a right angle.

It is preferable that a ground electrode of the first transmission filter and the second transmission filter and a ground electrode of the first reception filter and the second reception filter be separately provided on the substrate. In this case, interference of signals after having passed through the ground electrodes is suppressed and communication quality is further improved.

It is preferable that the substrate include a first substrate and a second substrate, the second substrate be mounted on the first substrate, the first diplexer be provided on the first substrate, and the second diplexer be provided on the second substrate. In this case, interference between the first diplexer and the second diplexer is more effectively reduced or prevented and the communication quality is further improved. In this case, for example, the first substrate may be defined by a resin substrate and the second substrate may be defined by a ceramic substrate. Alternatively, as a reverse configuration, the first substrate may be defined by the ceramic substrate and the second substrate may be defined by the resin substrate. Furthermore, the first substrate and the second substrate may be defined by the same substrate and both of the first and second substrates may be defined by the ceramic substrate or the resin substrate.

It is preferable that each of the first transmission filter and the second transmission filter be a low pass filter, and each of the first reception filter and the second reception filter be a high pass filter or a band pass filter. In this case, interference between the transmission and reception sides is effective reduced or prevented and the communication quality is further improved.

It is preferable that at least one inductor element be mounted on the substrate, a metal case having two opposing side surfaces which are opened be mounted on the substrate so as to cover the inductor element, and a magnetic flux formation direction of the at least one inductor element be identical or substantially identical to a direction of the opening of the metal case. In this case, shielding with the metal case is provided. Therefore, the diplexer module including the switch does not receive noise from the outside and the diplexer module including the switch does not transmit noise to the outside. Furthermore, the magnetic flux formation direction of the inductor element and the direction of the opening of the metal case are preferably identical or substantially identical to each other. Therefore, magnetic flux formation inhibition of the inductor element due to the metal case is reduced or prevented.

A third diplexer including a third transmission filter and a third reception filter may preferably be provided on the substrate, the third diplexer is provided in a substantially U-shaped region on the substrate and a substantially rectangular region in which the first diplexer and the second diplexer are located is provided at an inner side of the substantially U-shaped region when the substrate is seen in plan view from above, and the first transmission filter, the second transmission filter, and the third transmission filter are adjacent to one another and the first reception filter, the second reception filter, and the third reception filter are adjacent to one another. In this case, three diplexers are included. Therefore, transmission and reception are able to be performed with three sets of different communication frequencies and no intersection of signal lines is provided between the diplexers and the high-frequency circuit, such that deterioration in the communication quality due to interference between the transmission and reception sides is reduced or prevented.

An n-th diplexer including an n-th transmission filter and an n-th reception filter may preferably be further provided on the substrate (n is an integer of equal to or more than 4), the n-th diplexer is provided in a substantially U-shaped region on the substrate and a substantially rectangular region in which a plurality of diplexers of the first diplexer to a (n−1)-th diplexer are located is provided at an inner side of the substantially U-shaped region when the substrate is seen in plan view from above, and a plurality of transmission filters of the first transmission filter to the n-th transmission filter are adjacent to one another and a plurality of reception filters of the first reception filter to the n-th reception filter are adjacent to one another. In this case, n diplexers are included. Therefore, transmission and reception can be performed with n sets of different communication frequencies and no intersection of signal lines is formed between the diplexers and the high-frequency circuit, thus reducing or preventing deterioration in the communication quality due to interference between the transmission and reception sides.

In the above configuration, the switch is preferably provided in a main body of the diplexer module with the switch. However, the improved isolation characteristics between the transmission and reception sides are also able to be achieved with a diplexer module in which no switch is provided in the main body. A diplexer module according to another preferred embodiment of the present invention includes a substrate, a first diplexer provided on the substrate and including a first transmission filter and a first reception filter, and a second diplexer provided on the substrate and including a second transmission filter and a second reception filter, wherein the first diplexer is located in a substantially U-shaped region on the substrate and a substantially rectangular region in which the second diplexer is located is provided at an inner side of the substantially U-shaped region when the substrate is seen in plan view from above, and the first transmission filter, the second transmission filter, the second reception filter, and the first reception filter are aligned in this order.

In the above-described configuration, the diplexer module including no switch in the main body is also able to be used in the same or similar manner as the diplexer module including the switch according to a preferred embodiment of the present invention by a method in which a switch is provided externally or a plurality of antennas or cables are provided. Furthermore, the diplexer module according to a preferred embodiment of the present invention also has excellent isolation characteristics between the transmission and reception sides because no intersection of signal lines is provided between the diplexers and the high-frequency circuit.

Diplexer modules including a switch and a diplexer module according to preferred embodiments of the present invention have excellent isolation characteristics between the transmission and reception sides because no intersection of signal lines is provided between diplexers and a high-frequency circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
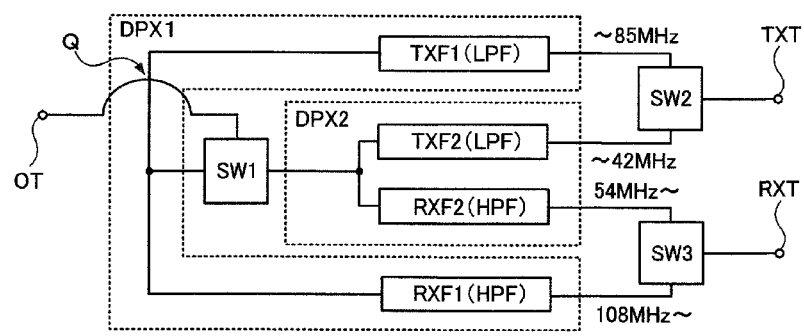
FIG. 1 is a schematic circuit diagram of a diplexer module including a switch according to a first preferred embodiment of the present invention.

Hereinafter, preferred embodiments of the present invention will be described with reference to the drawings.

It should be noted that respective preferred embodiments of the present invention are provided as examples, and the present invention is not limited by the preferred embodiments. Elements and features described in different preferred embodiments can be combined.

The drawings facilitate understanding of the preferred embodiments and are not necessarily accurately drawn to scale in some cases. For example, ratios of dimensions of drawn constituent components and ratios of dimensions among the constituent components are not identical to ratios of dimensions thereof that are described in the specification in some cases. Furthermore, the constituent components that are described in the specification may be omitted in the drawings or a reduced number thereof may be drawn in some cases.

First Preferred Embodiment

Figure 2:
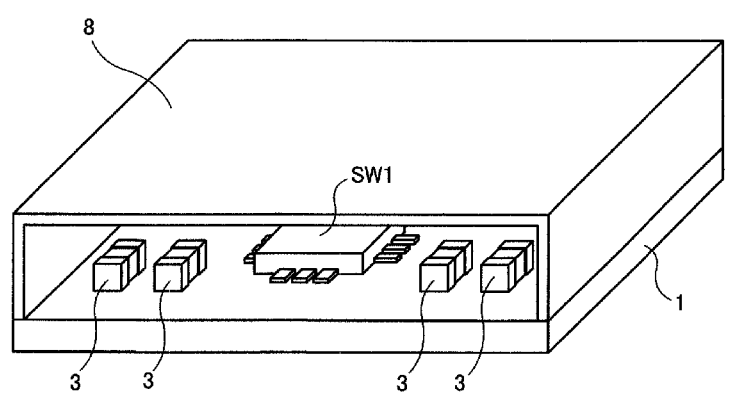
FIG. 2 is a perspective view of the diplexer module including the switch.
Figure 3A:
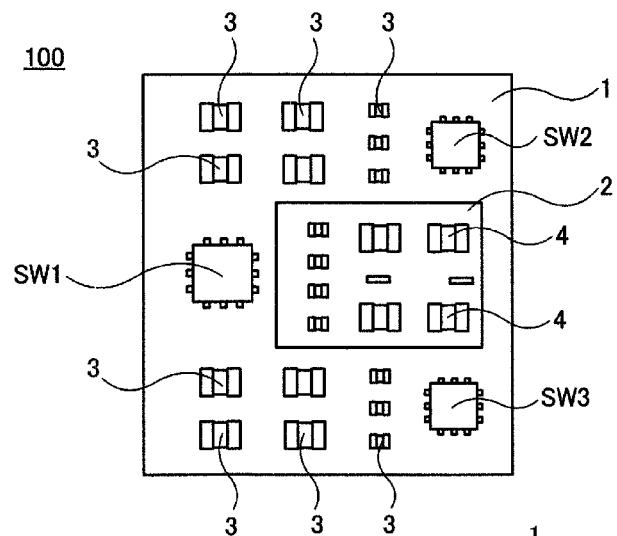
FIG. 3A is an exploded plan view of the diplexer module including the switch from which a metal case is removed.
Figure 3B:
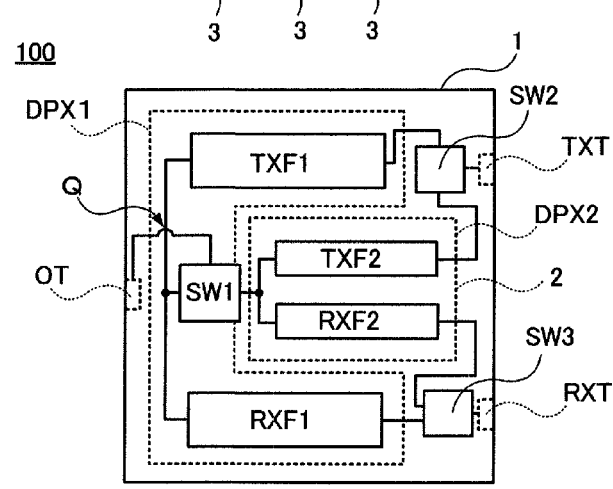
FIG. 3B is a plan view showing the positions of respective constituent components on a first substrate and a second substrate of the diplexer module with the switch.
Figure 3C:
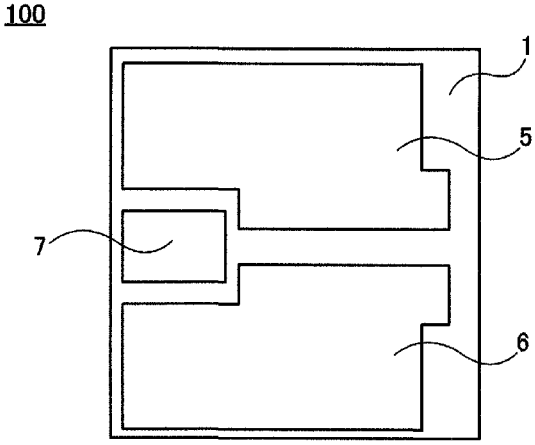
FIG. 3C is a see-through plan view showing ground electrodes provided in the first substrate of the diplexer module including the switch.

FIG. 1, FIG. 2, and FIGS. 3A to 3C illustrate a diplexer module including a switch 100 according to a first preferred embodiment of the present invention. FIG. 1 is a schematic circuit diagram of the diplexer module 100. FIG. 2 is a perspective view of the diplexer module 100. FIG. 3A is an exploded plan view of the diplexer module 100 from which a metal case 8 is removed. FIG. 3B is a plan view showing the positions of respective constituent components on a first substrate 1 and a second substrate 2 of the diplexer module 100. FIG. 3C is a see-through plan view showing ground electrodes provided in the first substrate 1 of the diplexer module 100.

First, the circuit of the diplexer module 100 according to the first preferred embodiment will be described with reference to FIG. 1.

The diplexer module 100 includes an external connection terminal OT, a transmission terminal TXT, a reception terminal RXT, a first diplexer DPX1, a second diplexer DPX2, a first switch SW1, a second switch SW2, and a third switch SW3.

The first diplexer DPX1 includes a first transmission filter TXF1 and a first reception filter RXF1. In the same or similar manner, the second diplexer DPX2 includes a second transmission filter TXF2 and a second reception filter RXF2.

Each of the first switch SW1, the second switch SW2, and the third switch SW3 includes one fixed terminal and two switching terminals. Furthermore, each of the first switch SW1, the second switch SW2, and the third switch SW3, if necessary, includes a control terminal V1 structured to switch (selecting any one of) the two switching terminals, a power supply terminal VDD structured to supply electric power driving the switch, and other suitable terminals.

The external connection terminal OT is connected to the fixed terminal of the first switch SW1. One switching terminal of the first switch SW1 is connected to the first diplexer DPX1 and the other switching terminal of the first switch SW1 is connected to the second diplexer DPX2.

The first diplexer DPX1 connected to the first switch SW1 is branched into two signal lines, and the first transmission filter TXF1 is provided on one signal line (first transmission signal line) and the first reception filter RXF1 is provided on the other signal line (first reception signal line). In the same or similar manner, the second diplexer DPX2 connected to the first switch SW1 is branched into two signal lines, and the second transmission filter TXF2 is provided on one signal line (second transmission signal line) and the second reception filter RXF2 is provided on the other signal line (second reception signal line).

The first transmission filter TXF1 of the first diplexer DPX1 is connected to one switching terminal of the second switch SW2 and the second transmission filter TXF2 of the second diplexer DPX2 is connected to the other switching terminal of the second switch SW2. Furthermore, the first reception filter RXF1 of the first diplexer DPX1 is connected to one switching terminal of the third switch SW3 and the second reception filter RXF2 of the second diplexer DPX2 is connected to the other switching terminal of the third switch SW3.

The fixed terminal of the second switch SW2 is connected to the transmission terminal TXT and the fixed terminal of the third switch SW3 is connected to the reception terminal RXT.

In the diplexer module 100, a signal line connecting the external connection terminal OT and the first switch SW1 intersects with the one signal line (first transmission signal line) of the first diplexer at a point Q. However, the intersection of the signal lines at the point Q imparts an extremely small degree of influence causing deterioration in communication quality. This is because even if a reception signal is mixed into a transmission signal at the point Q, that is, even if the reception signal having a small amplitude is mixed into the transmission signal having a large amplitude, an S/N ratio is not substantially changed. Furthermore, even if the transmission signal is mixed into the reception signal, the first reception filter RXF1 or the second reception filter RXF2 is able to remove the transmission signal.

The diplexer module 100 selects and connects any one of the first diplexer DPX1 and the second diplexer DPX2 to between the external connection terminal OT and the transmission terminal TXT and the reception terminal RXT by switching the first switch SW1, the second switch SW2, and the third switch SW3 in a linkage manner, thus performing communication with two different frequency bands.

In the present preferred embodiment, for example, the first transmission filter TXF1 of the first diplexer DPX1 preferably is an LC low pass filter LPF having a cutoff frequency of about 85 MHz and the first reception filter RXF1 of the first diplexer DPX1 preferably is an LC high pass filter HPF having a cutoff frequency of about 108 MHz. Furthermore, the second transmission filter TXF2 of the second diplexer DPX2 preferably is an LC low pass filter LPF having a cutoff frequency of about 42 MHz and the second reception filter RXF2 of the second diplexer DPX2 preferably is an LC high pass filter HPF having a cutoff frequency of about 54 MHz. Although in the present preferred embodiment, both of the first reception filter RXF1 and the second reception filter RXF2 preferably are high pass filters HPF, the first reception filter RXF1 and the second reception filter RXF2 preferably are band pass filters BPF instead.

The diplexer module 100 is able to perform transmission and reception in accordance with DOCSIS3.1 when the first diplexer DPX1 is selected. On the other hand, the diplexer module 100 is able to perform transmission and reception in accordance with DOCSIS3.0 when the second diplexer DPX2 is selected.

Then, the specific configuration of the diplexer module 100 will be described with reference to FIG. 2 and FIGS. 3A to 3C.

The diplexer module 100 includes the first substrate 1 and the second substrate 2. The first substrate 1 is preferably larger than the second substrate 2.

The first substrate 1 is preferably defined by a multilayered substrate (resin substrate) made of resin, for example.

The second substrate 2, the first switch SW1, the second switch SW2, the third switch SW3, and a plurality of electronic components 3 are mounted on the upper main surface of the first substrate 1. The electronic components 3 are inductor elements and capacitor elements. It should be noted that the electronic components 3 may include electronic components other than the inductor elements and the capacitor elements.

The external connection terminal OT, the transmission terminal TXT, and the reception terminal RXT are provided on the lower main surface of the first substrate 1. It should be noted that the external connection terminal OT, the transmission terminal TXT, and the reception terminal RXT are schematically illustrated in FIG. 3B but are not illustrated in other drawings.

As illustrated in FIG. 3C, a transmission ground electrode 5, a reception ground electrode 6, and a switch (first switch SW1) ground electrode 7 are provided on layers in the first substrate 1 so as to be isolated from one another.

The electronic components (the inductor elements, the capacitor elements, and resistor elements) 3 mounted on the first substrate 1 define the first transmission filter TXF1 and the first reception filter RXF1 of the first diplexer DPX1. As described above, the first transmission filter TXF1 is the LC low pass filter LPF and the first reception filter RXF1 is the LC high pass filter HPF.

The second substrate 2 is preferably defined by a multilayered substrate (ceramic substrate) made of ceramic, for example.

A plurality of electronic components 4 are mounted on the upper main surface of the second substrate 2. The electronic components 4 are inductor elements. It should be noted that the electronic components 4 may include electronic components other than the inductor elements, for example, a capacitor element.

Although not illustrated in the drawings, a capacitor electrode is provided on a layer in the second substrate 2 and a plurality of capacitors are provided thereon. Furthermore, an inductor electrode is provided on a layer in the second substrate 2 and inductors are also provided thereon.

The electronic components (inductor elements) 4 mounted on the second substrate 2 and the capacitors and the inductors provided in the second substrate 2 define the second transmission filter TXF2 and the second reception filter RXF2 of the second diplexer DPX2. As described above, the second transmission filter TXF2 is a LC low pass filter LPF and the second reception filter RXF2 is a LC high pass filter HPF.

As illustrated in FIG. 2, the metal case 8 including two opposing side surfaces which are opened is mounted on the upper main surface of the first substrate 1. The metal case 8 provides a shield function and prevents malfunctioning of the diplexer module 100 due to noise from the outside. Furthermore, the metal case 8 prevents noise generated by the diplexer module 100 from being transmitted to the outside.

By making the direction of the opening of the metal case and the magnetic flux formation direction of the inductor elements (electronic components 3 and 4) identical or substantially identical to each other, the inhibition of formation of magnetic fluxes of the inductor elements (electronic components 3 and 4) due to the metal case 8 is prevented, thus reducing insertion loss of the diplexer module 100 and improving the frequency characteristics.

Next, formation regions of the first diplexer DPX1 (the first transmission filter TXF1 and the first reception filter RXF1) and the second diplexer DPX2 (the second transmission filter TXF2 and the second reception filter RXF2) on the first substrate 1 and the second substrate 2 will be described with reference to FIG. 3A and FIG. 3B.

On the substrate including the first substrate 1 and the second substrate 2, a region (region with only the first substrate 1) in which the first substrate 1 and the second substrate 2 do not overlap with each other is defined as a first region and a region in which the first substrate 1 and the second substrate 2 overlap with each other is defined as a second region. The second substrate 2 is mounted on the first substrate 1 so as to deviate from a center portion of the first substrate 1 in a direction toward any one side of the four sides of the first substrate 1. For example, in the present preferred embodiment, as illustrated in FIG. 3A, the second substrate 2 is mounted on the first substrate 1 so as to deviate from the center portion of the first substrate 1 in a direction toward the right side of the first substrate 1 in the drawing. Accordingly, the first region has a substantially U shape (or may have a substantially n shape, a substantially C shape, or a substantially square shape with a left side open). Furthermore, the second region is provided at the inner side of the substantially U-shaped portion of the first region and has a substantially rectangular shape.

The first diplexer DPX1 (the first transmission filter TXF1 and the first reception filter RXF1) is defined by the electronic components 3 mounted on the first substrate 1 as described above and is therefore located in the substantially U-shaped first region. On the other hand, the second diplexer DPX2 (the second transmission filter TXF2 and the second reception filter RXF2) is defined by the electronic components (inductor elements) 4 mounted on the second substrate 2 and the capacitors and the inductors provided in the second substrate 2 as described above and is therefore located in the substantially rectangular second region.

Furthermore, on the substrate (the first substrate 1 and the second substrate 2), the first transmission filter TXF1 of the first diplexer DPX1 and the second transmission filter TXF2 of the second diplexer DPX2 are adjacent to each other. The first reception filter RXF1 of the first diplexer DPX1 and the second reception filter RXF2 of the second diplexer DPX2 are adjacent to each other. That is to say, the first transmission filter TXF1, the second transmission filter TXF2, the second reception filter RXF2, and the first reception filter RXF1 are aligned in this order.

The diplexer module 100 in the first preferred embodiment, which includes the above-described circuit and configuration, has the following characteristics.

First, in the diplexer module 100, the first transmission filter TXF1 and the second transmission filter TXF2 are adjacent to each other and the first reception filter RXF1 and the second reception filter RXF2 are adjacent to each other on the substrate (the first substrate 1 and the second substrate 2). Therefore, no point at which the signal lines intersect with each other is provided between the first diplexer DPX1 and the second diplexer DPX2 and the transmission terminal TXT and the reception terminal RXT. When the diplexer module 100 is connected to a high-frequency circuit, such as an RFIC or other suitable high-frequency circuit, no point at which the signal lines intersect with each other is provided between the diplexer module 100 and the high-frequency circuit. As a result, the diplexer module 100 is not likely to generate interference between the transmission and reception sides and is therefore has excellent isolation characteristics between the transmission and reception sides.

Furthermore, in the diplexer module 100, the transmission ground electrode 5 of the first transmission filter TXF1 and the second transmission filter TXF2 and the reception ground electrode 6 of the first reception filter RXF1 and the second reception filter RXF2 are separately provided on the first substrate 1. As a result, the diplexer module 100 is not likely to generate interference of signals between the transmission and reception sides after having passed through the ground electrodes and therefore improves communication quality.

In the diplexer module 100, the substrate is defined by the first substrate 1 and the second substrate 2 in a divided manner, the second substrate 2 is mounted on the first substrate 1, the first diplexer DPX1 is provided on the first substrate 1, and the second diplexer DPX2 is provided on the second substrate 2. That is to say, the first diplexer DPX1 and the second diplexer DPX2 are provided on the different substrates. As a result, the diplexer module 100 is not likely to generate interference between the first diplexer DPX1 and the second diplexer DPX2 and therefore improves communication quality also in this point.

Second Preferred Embodiment

Figure 4:
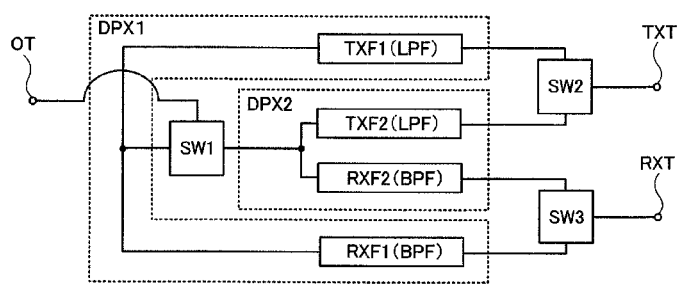
FIG. 4 is a schematic circuit diagram of a diplexer module with a switch according to a second preferred embodiment of the present invention.

FIG. 4 illustrates a diplexer module including a switch 200 according to a second preferred embodiment of the present invention. FIG. 4 is a schematic circuit diagram of the diplexer module with the switch 200.

The diplexer module 200 according to the second preferred embodiment is configured by changing a portion of the circuit in the diplexer module 100 in the above-described first preferred embodiment. To be specific, in the diplexer module 100, both of the first reception filter RXF1 of the first diplexer DPX1 and the second reception filter RXF2 of the second diplexer DPX2 preferably are high pass filters HPF. In the diplexer module 200, instead, both of the first reception filter RXF1 of the first diplexer DPX1 and the second reception filter RXF2 of the second diplexer DPX2 are preferably band pass filters BPF. Other configurations of the diplexer module 200 are the same or substantially the same as those in the diplexer module 100.

The diplexer module 200 also has excellent isolation characteristics between the transmission and reception sides as in the diplexer module 100.

Third Preferred Embodiment

Figure 5:
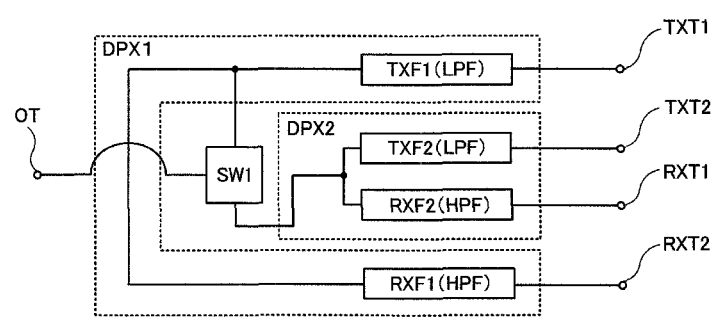
FIG. 5 is a schematic circuit diagram of a diplexer module with a switch according to a third preferred embodiment of the present invention.

FIG. 5 illustrates a diplexer module including a switch 300 according to a third preferred embodiment of the present invention. FIG. 5 is a schematic circuit diagram of the diplexer module 300.

The diplexer module 300 in the third preferred embodiment is configured by changing a portion of the circuit in the diplexer module 100 in the above-described first preferred embodiment. To be specific, first, the second switch SW2 and the third switch SW3 are removed from the diplexer module 100. Furthermore, the transmission terminal TXT in the diplexer module 100 is divided into two of a first transmission terminal TXT1 and a second transmission terminal TXT2 and the reception terminal RXT therein is divided into two of a first reception terminal RXT1 and a second reception terminal RXT2. The first transmission filter TXF1 is connected to the first transmission terminal TXT1, the second transmission filter TXF2 is connected to the second transmission terminal TXT2, the first reception filter RXF1 is connected to the first reception terminal RXT1, and the second reception filter RXF2 is connected to the second reception terminal RXT2. Other configurations of the diplexer module 300 are the same or substantially the same as those in the diplexer module with the switch 100.

In the diplexer module 300, the first transmission terminal TXT1, the second transmission terminal TXT2, the first reception terminal RXT1, and the second reception terminal RXT2 are connected to a high-frequency circuit directly or with a switch interposed therebetween for use.

Also in the diplexer module 300, no point at which signal lines intersect with each other is provided between the diplexer module 300 and a high-frequency circuit. Accordingly, the diplexer module 300 is also excellent in isolation characteristics between the transmission and reception sides in the same or similar manner as the diplexer module 100.

Fourth Preferred Embodiment

Figure 6:
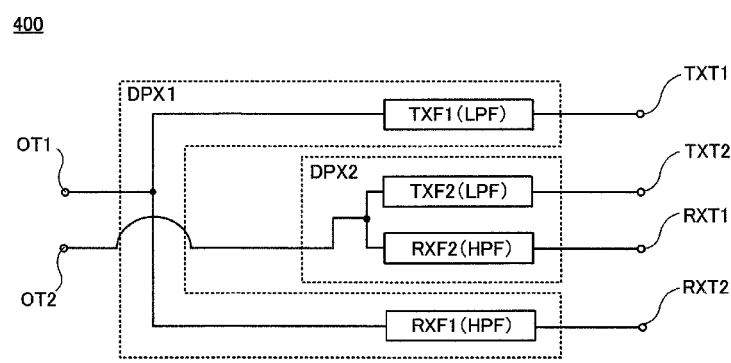
FIG. 6 is a schematic circuit diagram of a diplexer module according to a fourth preferred embodiment of the present invention.

FIG. 6 illustrates a diplexer module 400 according to a fourth preferred embodiment. FIG. 6 is a schematic circuit diagram of the diplexer module 400.

The diplexer module 400 in the fourth preferred embodiment is configured by further changing a portion of the circuit in the diplexer module 300 in the above-described third preferred embodiment. To be specific, first, the first switch SW1 is removed from the diplexer module 300. Furthermore, the external connection terminal OT of the diplexer module 300 is divided into a first external connection terminal OT1 and a second external connection terminal OT2. The first diplexer DPX1 is connected to the first external connection terminal OT1 and the second diplexer DPX2 is connected to the second external connection terminal OT2. Other configurations of the diplexer module 400 are the same or substantially the same as those in the diplexer module 300.

The diplexer module 400 is used by preparing one switch (not illustrated) disposed outside of the diplexer module 400, connecting the first external connection terminal OT1 to one switching terminal of the switch, connecting the second external connection terminal OT2 to another switching terminal of the switch, and connecting a fixed terminal of the switch to a cable, an antenna, or other suitable component of a cable television. Alternatively, the diplexer module 400 is used by connecting the first external connection terminal OT1 and the second external connection terminal OT2 to cables, antennas, or other suitable components of different cable televisions.

Also in the diplexer module 400, no point at which signal lines intersect with each other is provided between the first diplexer DPX1 and the second diplexer DPX2 and a high-frequency circuit. Accordingly, the diplexer module 400 also has excellent isolation characteristics between the transmission and reception sides in the same or similar manner as the diplexer modules in other preferred embodiments of the present invention.

Fifth Preferred Embodiment

Figure 7:
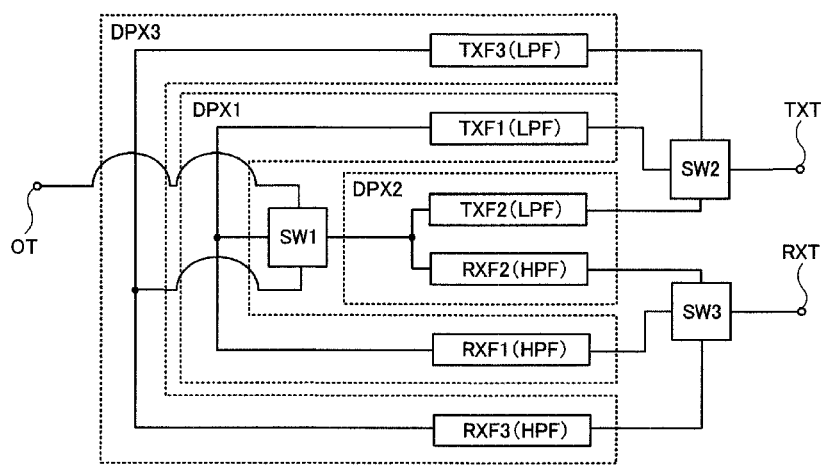
FIG. 7 is a schematic circuit diagram of a diplexer module with a switch according to a fifth preferred embodiment of the present invention.
Figure 8:
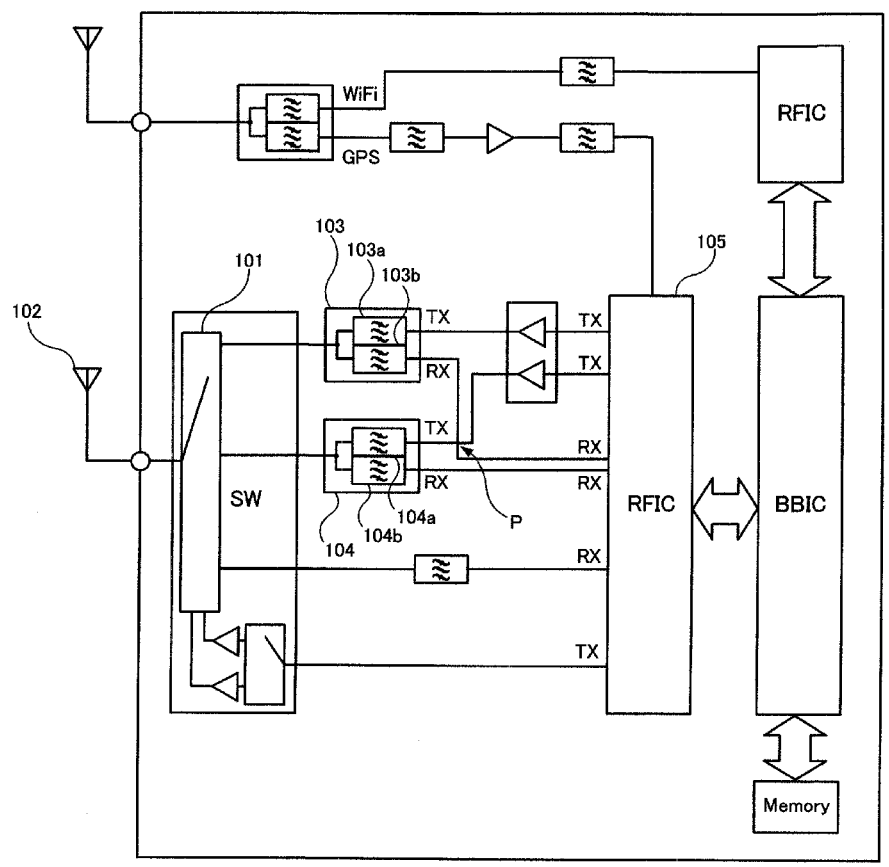
FIG. 8 is a circuit diagram of a diplexer module with a switch disclosed in Japanese Unexamined Patent Application Publication No. 2015-111803.
Figure 9A:
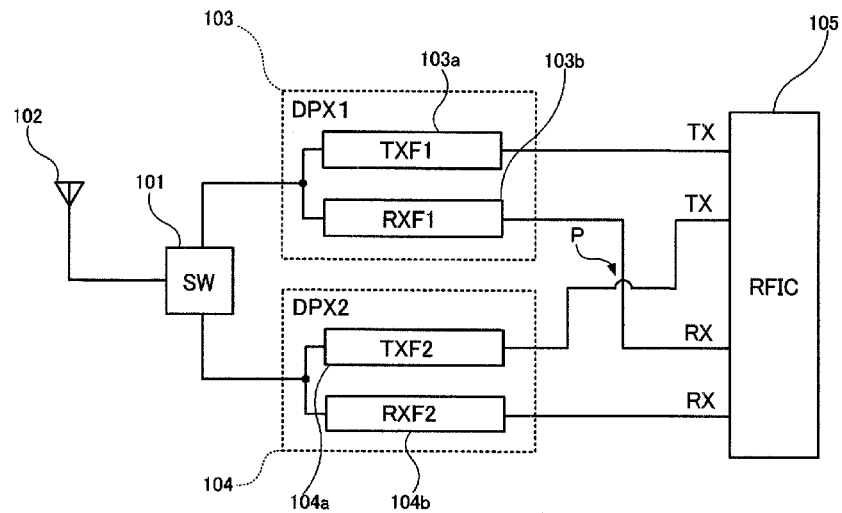
FIG. 9A is a schematic circuit diagram of the diplexer module with the switch.
Figure 9B:
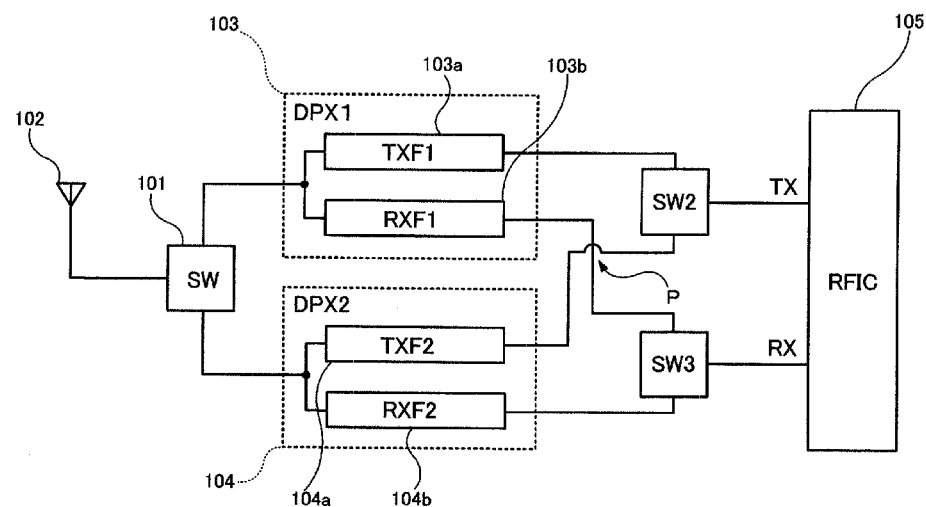
FIG. 9B is a schematic circuit diagram of a variation of the diplexer module with the switch.

FIG. 7 illustrates a diplexer module including a switch 500 according to a fifth preferred embodiment of the present invention. FIG. 7 is a schematic circuit diagram of the diplexer module 500.

Each of the diplexer modules 100 to 300 in the first preferred embodiment to the third preferred embodiment includes the first diplexer DPX1 and second diplexer DPX2. The diplexer module 500 in the fifth preferred embodiment is configured by adding a third diplexer DPX3 to the first diplexer DPX1 and the second diplexer DPX2.

The third diplexer DPX3 includes a third transmission filter and a third reception filter.

In the diplexer module 500, on a substrate, the third diplexer DPX3 is provided in a substantially U-shaped region and a substantially rectangular region in which the first diplexer DPX1 and the second diplexer DPX2 are located is provided at the inner side of the substantially U-shaped region. As a result, in the diplexer module 500, the first transmission filter TXF1, the second transmission filter TXF2, and the third transmission filter TXF3 are adjacent to one another and the first reception filter RXF1, the second reception filter RXF2, and the third reception filter RXF3 are adjacent to one another.

The more specific configuration of the diplexer module 500 is as follows.

The external connection terminal OT is provided on the substrate. The external connection terminal OT is connected to a fixed terminal of the first switch SW1. Furthermore, one switching terminal of the first switch SW1 is connected to the first diplexer DPX1, another switching terminal of the first switch SW1 is connected to the second diplexer DPX2, and still another switching terminal of the first switch SW1 is connected to the third diplexer DPX3.

Moreover, the first transmission filter TXF1 is connected to one switching terminal of the second switch SW2, the second transmission filter TXF2 is connected to another switching terminal of the second switch SW2, the third transmission filter TXF3 is connected to still another switching terminal of the second switch SW2. Furthermore, a fixed terminal of the second switch SW2 is connected to the transmission terminal TXT.

In the same manner, the first reception filter RXF1 is connected to one switching terminal of the third switch SW3, the second reception filter RXF2 is connected to another switching terminal of the third switch SW3, and the third reception filter RXF3 is connected to still another switching terminal of the third switch SW3. Furthermore, a fixed terminal of the third switch SW3 is connected to the reception terminal RXT.

The diplexer module 500 in the fifth preferred embodiment includes the three diplexers, thus performing transmission and reception with three sets of different communication frequencies.

In the diplexer module 500 in the fifth preferred embodiment, the first transmission filter TXF1, the second transmission filter TXF2, and the third transmission filter TXF3 are adjacent to one another and the first reception filter RXF1, the second reception filter RXF2, and the third reception filter RXF3 are adjacent to one another. Therefore, no point at which signal lines intersect with each other is provided between the first diplexer DPX1, the second diplexer DPX2, and the third diplexer DPX3 and a high-frequency circuit. Accordingly, the diplexer module 500 also reduces or prevents deterioration in communication quality due to interference between the transmission and reception sides as in the diplexer modules according to other preferred embodiments of the present invention.

Although the diplexer module 500 in the fifth preferred embodiment preferably is configured by adding the third diplexer DPX3 to the first diplexer DPX1 and the second diplexer DPX2, a fourth diplexer DPX4 and more diplexers DPX may further be added by the same or substantially the same manner. That is to say, the diplexer DPX can be added in a substantially U-shaped region on the substrate and providing the existing diplexers DPX in a substantially rectangular region at the inner side of the substantially U-shaped region. Also in such a diplexer module, no point at which signal lines intersect with each other is provided between the respective diplexers DPX and a high-frequency circuit, thus reducing or preventing deterioration in communication quality due to interference between the transmission and reception sides.

Furthermore, the diplexer module 400 in the fourth preferred embodiment can be also configured by adding the third diplexer DPX3 or more diplexers DPX as disclosed in the fifth preferred embodiment. Also in the diplexer module as described above, no point at which signal lines intersect with each other is provided between the respective diplexers DPX and a high-frequency circuit, thus reducing or preventing deterioration in communication quality due to interference between the transmission and reception sides.

The diplexer modules 100 to 300, and 500 in the first preferred embodiment to the third preferred embodiment and the fifth preferred embodiment and the diplexer module in the fourth preferred embodiment have been described above. However, the present invention is not limited to the above-described preferred embodiments.

For example, any circuit configuration may be used in the present invention and the circuit configuration is not limited to the configurations of the above-described preferred embodiments.

Furthermore, although the substrate is defined by the first substrate 1 and the second substrate 2 in the divided manner in the preferred embodiments, the first substrate 1 and the second substrate 2 may be combined and configured into one substrate instead.

Moreover, although each of the first substrate 1 and the second substrate 2 preferably is defined by the multilayered substrate in the preferred embodiments, any configuration of the substrates may be used and a single plate substrate may be used for each of the substrates.

In addition, although the first substrate 1 is made of resin and the second substrate 2 is made of ceramic in the preferred embodiments, any materials of the substrates may be used. For example, if the first substrate 1 is also made of a ceramic substrate and a capacitor electrode is provided to define capacitors and inductors in the first substrate 1, the capacitor elements and the inductor elements that are mounted as the electronic components 3 on the upper main surface of the first substrate 1 can be omitted.

Furthermore, any combination of the substrates of the respective diplexers may be used and, for example, the following configuration can also be used. That is, a substrate on which a first diplexer is provided and a substrate on which a second diplexer is provided may be mounted on the first substrate 1.

In the description of the preferred embodiments, communication (DOCSIS or other suitable communication) using the cable television line is disclosed. However, the diplexer module including the switch and the diplexer module according to the preferred embodiments of the present invention are not limited to being used in wired communication and can also be used in wireless communication.

While preferred embodiments of the present invention have been described above, it is to be understood that variations and modifications will be apparent to those skilled in the art without departing from the scope and spirit of the invention. The scope of the present invention, therefore, is to be determined solely by the following claims.

What is claimed is:

1. A diplexer module comprising:
   a substrate;

an external connection terminal provided on the substrate;
a first diplexer provided on the substrate and including a first transmission filter and a first reception filter;
a second diplexer provided on the substrate and including a second transmission filter and a second reception filter; and
a switch provided on the substrate; wherein
the external connection terminal is connected to a fixed terminal of the switch;
one switching terminal of the switch is connected to the first diplexer and another switching terminal of the switch is connected to the second diplexer; and
the first transmission filter, the second transmission filter, the second reception filter, and the first reception filter are aligned in this order when the substrate is seen in plan view from above.

2. The diplexer module with the switch according to claim 1, wherein a signal line connecting the external connection terminal and the switch intersects with an internal signal line of one of the first diplexer and the second diplexer when the substrate is seen in plan view from above.

3. The diplexer module with the switch according to claim 1, wherein
a transmission terminal and a reception terminal are provided on the substrate, and a second switch and a third switch are provided on the substrate;
the first transmission filter is connected to one switching terminal of the second switch, the second transmission filter is connected to another switching terminal of the second switch, and a fixed terminal of the second switch is connected to the transmission terminal; and
the first reception filter is connected to one switching terminal of the third switch, the second reception filter is connected to the other switching terminal of the third switch, and a fixed terminal of the third switch is connected to the reception terminal.

4. The diplexer module with the switch according to claim 1, wherein
the substrate includes a substantially U-shaped first region and a substantially rectangular second region provided at an inner side of the substantially U-shaped portion of the first region when the substrate is seen in plan view from above;
the first diplexer is provided in the first region; and
the second diplexer is provided in the second region.

5. The diplexer module with the switch according to claim 1, wherein a ground electrode of the first transmission filter and the second transmission filter and a ground electrode of the first reception filter and the second reception filter are separately provided on the substrate.

6. The diplexer module with the switch according to claim 1, wherein
the substrate is defined by a first substrate and a second substrate;
the second substrate is mounted on the first substrate;
the first diplexer is provided on the first substrate and;
the second diplexer is provided on the second substrate.

7. The diplexer module with the switch according to claim 6, wherein
the first substrate is a resin substrate; and
the second substrate is a ceramic substrate.

8. The diplexer module with the switch according to claim 1, wherein
each of the first transmission filter and the second transmission filter is a low pass filter; and
each of the first reception filter and the second reception filter is a high pass filter or a band pass filter.

9. The diplexer module with the switch according to claim 1, wherein
at least one inductor element is mounted on the substrate;
a metal case including two opposing side surfaces which define an opening is mounted on the substrate so as to cover the at least one inductor element; and
a magnetic flux formation direction of the at least one inductor element is identical or substantially identical to a direction of the opening of the metal case.

10. The diplexer module with the switch according to claim 1, wherein
a third diplexer including a third transmission filter and a third reception filter is further provided on the substrate;
the third diplexer is provided in a substantially U-shaped region on the substrate, and a substantially rectangular region in which the first diplexer and the second diplexer are located is provided at an inner side of the substantially U-shaped region when the substrate is seen in plan view from above; and
the first transmission filter, the second transmission filter, and the third transmission filter are adjacent to one another and the first reception filter, the second reception filter, and the third reception filter are adjacent to one another.

11. The diplexer module with the switch according to claim 10, wherein
an n-th diplexer including an n-th transmission filter and an n-th reception filter is provided on the substrate, where n is an integer of equal to or more than 4;
the n-th diplexer is provided in a substantially U-shaped region on the substrate, and a substantially rectangular region in which a plurality of diplexers of the first diplexer to a (n−1)-th diplexer are located is provided at an inner side of the substantially U-shaped region when the substrate is seen in plan view from above; and
a plurality of transmission filters of the first transmission filter to the n-th transmission filter are adjacent to one another and a plurality of reception filters of the first reception filter to the n-th reception filter are adjacent to one another.

12. A diplexer module comprising:
a substrate;
a first diplexer provided on the substrate and including a first transmission filter and a first reception filter; and
a second diplexer provided on the substrate and including a second transmission filter and a second reception filter;
wherein
the first diplexer is provided in a substantially U-shaped region on the substrate and a substantially rectangular region in which the second diplexer is located is provided at an inner side of the substantially U-shaped region when the substrate is seen in plan view from above; and
the first transmission filter, the second transmission filter, the second reception filter, and the first reception filter are aligned in this order.

13. The diplexer module with the switch according to claim 12, wherein a ground electrode of the first transmission filter and the second transmission filter and a ground electrode of the first reception filter and the second reception filter are separately provided on the substrate.

14. The diplexer module with the switch according to claim 12, wherein
the substrate is defined by a first substrate and a second substrate;

the second substrate is mounted on the first substrate;
the first diplexer is provided on the first substrate; and
the second diplexer is provided on the second substrate.

15. The diplexer module with the switch according to claim 14, wherein
the first substrate is a resin substrate; and
the second substrate is a ceramic substrate.

16. The diplexer module with the switch according to claim 12, wherein
each of the first transmission filter and the second transmission filter is a low pass filter; and
each of the first reception filter and the second reception filter is a high pass filter or a band pass filter.

17. The diplexer module with the switch according to claim 12, wherein
at least one inductor element is mounted on the substrate;
a metal case including two opposing side surfaces which define an opening is mounted on the substrate so as to cover the at least one inductor element; and
a magnetic flux formation direction of the at least one inductor element is identical or substantially identical to a direction of the opening of the metal case.

\* \* \* \* \*